(12) United States Patent
Mayer et al.

(10) Patent No.: US 7,214,928 B2
(45) Date of Patent: May 8, 2007

(54) SCANNING UNIT FOR AN OPTICAL POSITION MEASURING DEVICE

(75) Inventors: Elmar J. Mayer, Nussdorf (DE);
Wolfgang Holzapfel, Obing (DE);
Klaus Loeschcke, Berlin (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 572 days.

(21) Appl. No.: 10/258,964

(22) PCT Filed: Apr. 27, 2001

(86) PCT No.: PCT/DE01/01672

§ 371 (c)(1),
(2), (4) Date: Nov. 28, 2003

(87) PCT Pub. No.: WO01/84083

PCT Pub. Date: Nov. 8, 2001

(65) Prior Publication Data

US 2004/0119989 A1    Jun. 24, 2004

(30) Foreign Application Priority Data

Apr. 28, 2000   (DE) ................................ 100 22 619

(51) Int. Cl.
*G01B 11/14*   (2006.01)
*G01D 5/34*   (2006.01)

(52) U.S. Cl. ............................ 250/231.13; 250/231.14; 356/615; 356/619

(58) Field of Classification Search ....................... 250/231.13–231.18; 356/615, 619
See application file for complete search history.

(56) References Cited

U.S. PATENT DOCUMENTS

| 4,163,239 | A | * | 7/1979 | Carter | 257/246 |
| 4,499,374 | A | | 2/1985 | Kabaya | |
| 4,605,308 | A | | 8/1986 | Hankel et al. | |
| 4,652,693 | A | | 3/1987 | Bar-On | |
| 5,646,427 | A | * | 7/1997 | Smith et al. | 257/232 |
| 5,774,219 | A | * | 6/1998 | Matsuura | 356/499 |
| 5,981,942 | A | * | 11/1999 | Ieki | 250/231.16 |

(Continued)

FOREIGN PATENT DOCUMENTS

DE    32 29 343 C2    4/1993

(Continued)

OTHER PUBLICATIONS

Patent Abstracts of Japan regarding Japanese publication 60-154112, vol. 9, No. 329 (P-416), published Dec. 24, 1985, one page.

*Primary Examiner*—Thanh X. Luu
*Assistant Examiner*—Brian Livedalen
(74) *Attorney, Agent, or Firm*—Brinks Hofer Gilson & Lione

(57) ABSTRACT

A scanning unit for an optical position measuring device, the scanning unit having a structured optoelectronic photodetector that includes: a semiconductor substrate, a plurality of radiation-sensitive detector areas, which are arranged next to each other on the semiconductor substrate and a strip conductor, wherein at least a portion of the strip conductor is positioned across a surface defined by the plurality of detector areas and forms a connection with an associated detector area of the plurality of detector areas.

39 Claims, 4 Drawing Sheets

U.S. PATENT DOCUMENTS

| | | |
|---|---|---|
| 5,995,229 A | 11/1999 | Omi |
| 6,198,534 B1 | 3/2001 | Höfer et al. |
| 6,392,224 B1 | 5/2002 | Holzapfel et al. |
| 6,614,479 B1 * | 9/2003 | Fukusho et al. ............ 348/340 |

FOREIGN PATENT DOCUMENTS

| | | |
|---|---|---|
| DE | 198 43 155 A1 | 4/1999 |
| JP | 60-154112 | 8/1985 |
| WO | WO 99/08074 | 2/1999 |

* cited by examiner

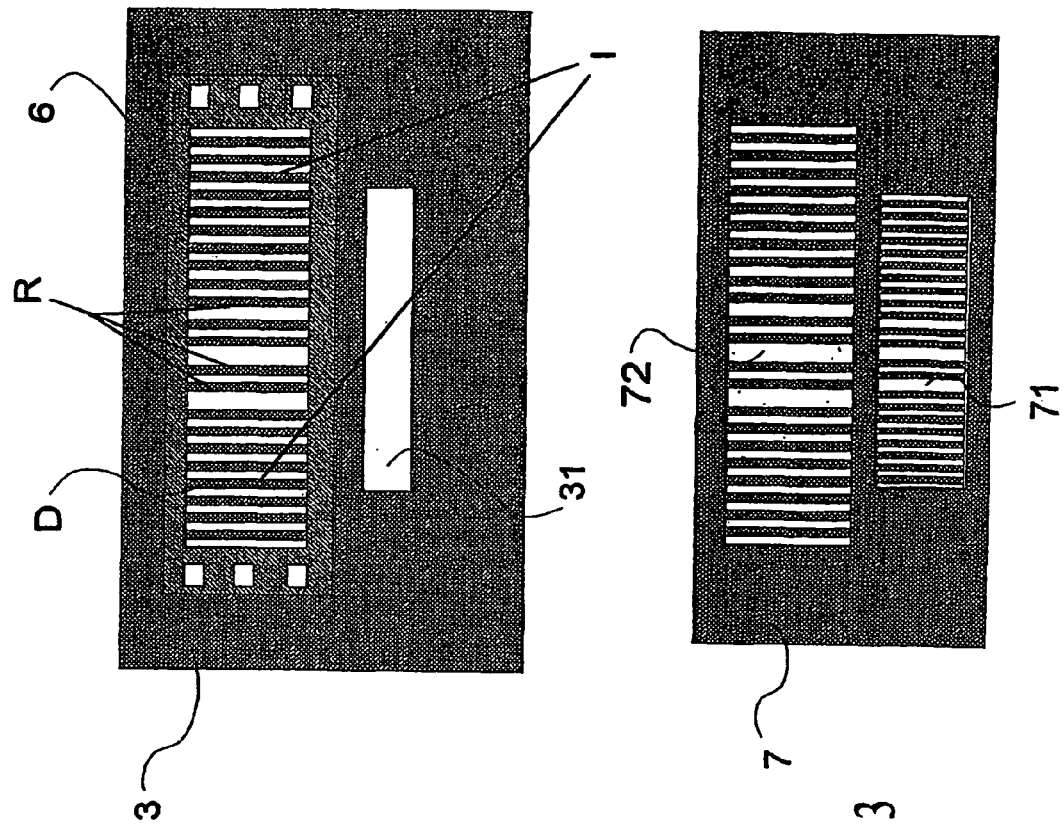
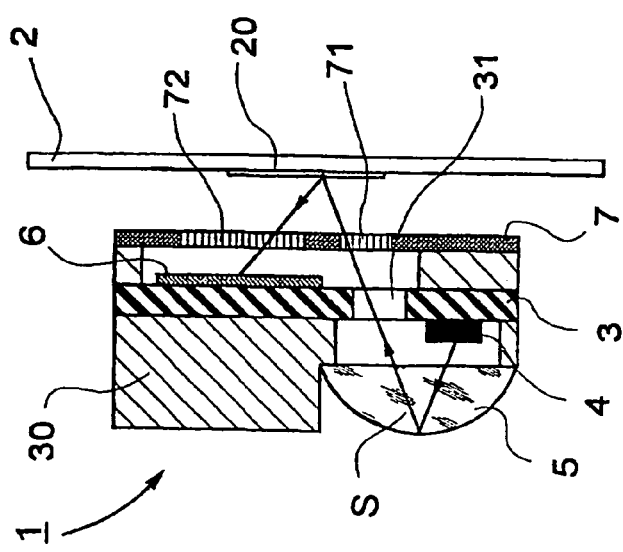
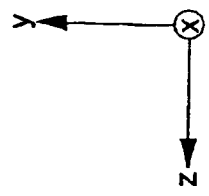

SCANNING UNIT FOR AN OPTICAL POSITION MEASURING DEVICE

Applicants claim, under 35 U.S.C. §§ 120 and 365, the benefit of priority of the filing date of Apr. 27, 2001 of a Patent Cooperation Treaty patent application, copy attached, Serial Number PCT/DE01/01672, filed on the aforementioned date, the entire contents of which are incorporated herein by reference, wherein Patent Cooperation Treaty patent application Serial Number PCT/DE01/01672 was not published under PCT Article 21 (2) in English.

Applicants claim, under 35 U.S.C. § 119, the benefit of priority of the filing date of Apr. 28, 2000 of a German patent application, copy attached, Serial Number 100 22 619.1, filed on the aforementioned date, the entire contents of which are incorporated herein by reference.

BACKGROUND OF THE INVENTION

1. Field of the Invention

The present invention relates to a scanning unit for an optical position measuring device.

2. Description of the Related Art

A scanning unit for an optical position measuring device is known from WO 99/08074 which, besides periodic incremental signals, also delivers at least one reference pulse signal at a defined reference position of a scale and at a scanning unit which can be moved in relation to the latter. At least one reference marker field is arranged on the scale and is integrated in an incremental graduation track, and the scanning device includes a detector arrangement which has at least three active detector areas arranged next to each other in the measuring direction. Two of the three detector areas constitute reference pulse signal detector areas and are used for generating a reference pulse signal, wherein the relative arrangement of the reference pulse signal detector areas in the measuring direction has been selected as a function of the structuring of the reference marker field on the scale. A detector area arranged between the reference pulse signal detector areas is used for generating at least one incremental signal.

As can be seen in particular in FIG. 3a of this publication showing an arrangement of active detector areas for the reference pulse signal areas, as well as for incremental signal detector areas, contact between the various active detector areas takes place at the front sides of the detector areas and, because of the many parallel line arrangements, the arrangement at the side of the detector areas requires a large amount of space on the printed circuit board, or on the semiconductor substrate of the photodetector, on which the active detector areas and the strip conductors making contact are to be arranged. Therefore this space required for the strip conductors on the side of the active detector areas cannot be used for the active detector areas on the semiconductor substrate for receiving the detector areas and the strip conductors.

However, it is of particular importance for creating the incremental and reference pulse signals to make the radiation-sensitive detector areas of the photodetector with the largest possible surface in order to couple in as much light as possible, which was received by the transmitted light or incident light methods, on the receiving side of the scanning unit. However, this is contraindicated by the miniaturization of the optical position measuring device, wherein the scanning unit should require the smallest possible volume, which results in that there is only a small surface available on the substrate for the detector areas. In connection with a relative and absolute measurement it is necessary to arrange the incremental signal detector areas, as well as the reference pulse detector areas, on this surface in such a way that a flawless detection and delivery of incremental and reference pulse signals is assured even under the most adverse conditions, such as heavy contamination.

SUMMARY AND OBJECTS OF THE INVENTION

It is therefore an object of the present invention to optimally utilize the surface available for the detector areas on the substrate of a photodetector of a scanning unit.

In accordance with the present invention, this object is attained by a scanning unit for an optical position measuring device, the scanning unit having a structured optoelectronic photodetector that includes: a semiconductor substrate, a plurality of radiation-sensitive detector areas, which are arranged next to each other on the semiconductor substrate and a strip conductor, wherein at least a portion of the strip conductor is positioned across a surface defined by the plurality of detector areas and forms a connection with an associated detector area of the plurality of detector areas.

The solution in accordance with the present invention makes possible the optimal utilization of the surface available for the detector areas on the substrate of a photodetector of a scanning unit for the generation of incremental signals and, if required, reference pulse signals, in that the entire substrate or printed circuit board area, in particular the width of the substrate extending transversely to the measuring direction, can be used completely for the detector areas, because the strip conductors leading to the individual detector areas are conducted across the surface of the detector areas and are connected with the appropriate detector areas. The optimal utilization of the (expensive) silicone semiconductor substrate area does not only take the miniaturization of the photodetector into account, but also reduces the production costs.

The solution in accordance with the present invention has the particular advantage that for the generation of the scanning signals the linear extension of the detector areas transversely to the measuring direction is maximal, so that sufficient light can still be coupled in even under the most adverse conditions.

The detector areas preferably include narrow strips in the form of triangles or sections of circles, which are sensitive to radiation and whose long sides are arranged substantially next to each other perpendicular to the measuring direction, and the strip conductors are substantially conducted perpendicular to the long sides of the detector areas.

An advantageous embodiment of the solution in accordance with the present invention is distinguished in that the optoelectronic photodetector has thin, strip-shaped layers of the other conductivity type which constitute the detector areas and are arranged on a semiconducting base body of the first conductivity type, has an anti-reflection layer constituting the front of the photodetector and an insulating layer arranged therebetween, and that openings in the anti-reflection layer are provided between the strip conductors and the respective detector areas at the connections of the strip conductors with associated detector areas. Alternatively to this, the anti-reflection layer can be connected with the thin, strip-shaped layers of the other conductivity type at the connections of the strip conductors with associated detector areas in order to create contact points for coupling out the charge stored in the respective detector area.

A further development of the solution in accordance with the present invention is distinguished in that the detector areas are arranged periodically and equidistant from each other, wherein a plurality of adjoining detector areas form a group which delivers scanning signals which are phase-shifted with respect to each other, and that respectively one strip conductor is connected with the detector areas of the various groups which emit in-phase scanning signals.

A so-called "single field scan" of the scale is assured by the detector areas combined in groups, wherein all signal portions for generating the scanning signals always stem from a graduation period of the scanned scale. Such an arrangement is particularly advantageous in view of its insensitivity to contamination of the scale, since the phase-shifted signal portions contributing to the generation of the scanning signals are all affected in the same way.

Respectively four active detector areas preferably form one group providing four scanning signals each of which is phase-shifted by 90°, wherein at least two groups of active detector areas are arranged next to each other in the measuring direction and four parallel strip conductors are connected with the detector areas of the groups which emit in-phase scanning signals.

Furthermore, several groups of active detector areas can be advantageously arranged one behind the other and next to each other in the measuring direction, wherein a number of strip conductors corresponding to the phase shift is connected with the detector areas of the groups arranged one behind the other in the measuring direction which deliver in-phase scanning signals. The strip conductors, which detect in-phase scanning signals, of the groups which are arranged parallel with each other in the measuring direction then are connected with each other.

The connections of the strip conductors which detect in-phase scanning signals of the groups which are arranged parallel with each other in the measuring direction can be arranged on the rear of the structured photodetector in particular.

For operating such a scanning unit, the structured photodetector preferably has several groups arranged one behind the other in the measuring direction, each with several detector areas, wherein one part of the groups contains reference pulse detector areas for generating reference pulse signals, and the other part of the groups containing incremental pulse detector areas for generating incremental signals. The reference pulse detector areas are connected with reference pulse strip conductors, and the incremental signal detector areas providing in-phase output signals, are each connected with an incremental signal strip conductor.

An advantageous further development of the solution in accordance with the present invention is distinguished in that at least the incremental signal strip conductors are conducted across radiation-sensitive surfaces of the incremental signal detector areas and are each connected with incremental signal detector areas which provide in-phase output signals.

Furthermore, two groups of incremental signal detector areas each having two groups of detector areas providing in-phase output signals and arranged one behind the other in the measuring direction and next to each other, and one group of reference pulse detector areas provided between the two groups of incremental signal detector areas, can be provided, wherein the incremental signal strip conductors are each conducted to the fronts of the structured photodetector. In this case the reference pulse strip conductors can be arranged between the groups of incremental signal detector areas which are arranged next to each other in the measuring direction.

For generating the reference pulse signals, the reference pulse strip conductor detecting the clock signals of the reference pulse detector areas can be conducted to the one front face between the groups of incremental signal detector areas of this side, which are arranged next to each other in the measuring direction, and the reference pulse strip conductor detecting the push-pull signals of the reference pulse detector areas can be conducted to the other front face between the groups of incremental signal detector areas of that side, which are arranged next to each other in the measuring direction.

Alternatively, the reference pulse strip conductors detecting the clock signals and the push-pull signals of the reference pulse detector areas and which are arranged in sections above each other, can be conducted between the groups of incremental signal detector areas of the one side, which are arranged next to each other in the measuring direction.

Since the strip conductors are provided with an insulating layer at least on the side facing the detector areas, the reference pulse strip conductors can be conducted, at least in part, across the oppositely arranged narrow sides of groups of incremental signal detector areas, which are arranged next to each other in the measuring direction.

Finally, the groups of incremental signal detector areas, which are arranged one behind the other in the measuring direction can each be connected with an incremental signal strip conductor for in-phase output signals, and the incremental signal strip conductors can be conducted across the reference pulse detector areas.

The concept on which the present invention is based will be explained in greater detail by exemplary embodiments represented in the drawings. Shown are in:

BRIEF DESCRIPTION OF THE DRAWINGS

FIGS. 1 to 3 show a side cross-sectional view of an embodiment of an optical position measuring device with a scanning unit and a scale, as well as an enlarged view from above on a printed circuit board and a scanning plate of the scanning unit in accordance with the present invention;

Figure 4:
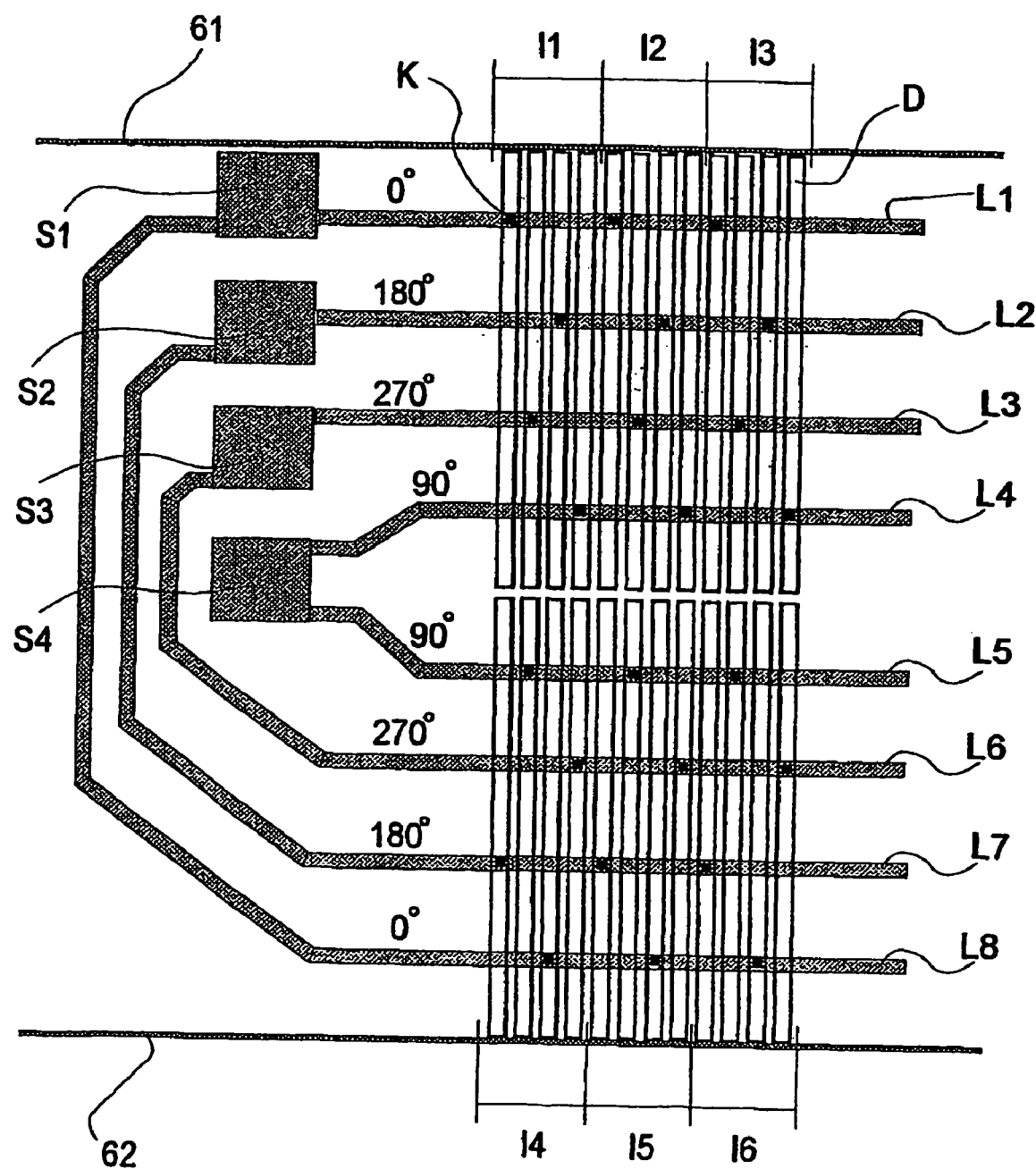
FIG. 4 shows a schematic representation of an embodiment of several groups of detector areas arranged one behind the other and next to each other for generating incremental signals, with strip conductors which make contact with detector areas with in-phase scanning signals in accordance with the present invention.

DESCRIPTION OF THE PREFERRED
EMBODIMENT(S) OF THE INVENTION

FIG. 1 represents a cross section through an optical position measuring device containing a scanning unit 1 and a scale 2, which can be moved in the measuring direction x in relation to the scanning unit 1. The scanning unit 1 includes a portion on the transmitting side, which contains a light source 4, embodied on a printed circuit board 3, shown in a view from above in FIG. 2, preferably in the form of a light-emitting diode attached to the surface of the board 3, and an optical collimating device 5 in the form of a cylindrical lens, which is fastened on a structure 30 connected with the printed circuit board 3 and faces the light source 4 with its flat face.

In the portion of the scanning unit 1 on the receiving side, a photodetector or photo sensor 6 with different active, radiation-sensitive detector areas D (FIG. 2), between which inactive, radiation-insensitive areas are arranged, is provided on the printed circuit board 3. A scanning plate 7, shown in a view from above in FIG. 3, which contains a transmitting structure 71 and a scanning structure 72 arranged next to each other in the measuring direction, is arranged at a short distance from the printed circuit board 3.

The scale 2 is arranged spaced apart from the scanning unit 1 and contains a measuring graduation 20 extending in the measuring direction x, whose optical scanning during the relative movement between the scanning unit 1 and the scale 2 provides scanning signals. The beam path S, schematically represented in FIG. 1, originates at the light source 4 and is reflected by the cylindrical lens 5 through an opening 31 provided in the printed circuit board 3 and extending in the measuring direction x to the scanning plate 7 and the transmitting structure 71 arranged on it, and reaches through the transmitting structure 71 the measuring graduation 20 arranged on the scale 2, from which the measuring beam S is reflected through the scanning structure 72 to the photodetector 6, which is preferably arranged on a semiconductor substrate and has the radiation-sensitive detector areas D provided thereon.

The optical position measuring device represented in FIG. 1 operates by incident light, so that the measuring graduation provided on the scale 2 has reflecting and non-reflecting partial areas, which reflect, or do not reflect, the beam path S. With an optical measuring device operating with transmitted light, the scale 2 is located between the portion of the scanning unit 1 on the transmitting side and its portion on the receiving side, so that the beam path originating at the light source 4 arrives, via the cylindrical lens 5 and the transmitting structure 71 of the scanning plate at the measuring graduation 20 of the scale 2, and through the measuring graduation 20 via the transmitting structure 71, at the photodetector 6 of the scanning device 1. In this case the scanning fields of the measuring graduation 20 provided on the scale 2 are embodied to be transparent and opaque in regard to the lightwave length used.

In order to provide an exact absolute relationship of the position measurement in connection with one or several defined relative positions of the parts of the position measuring device which are movable in relation to each other, so-called reference pulse signals are required, besides the incremental signals with respect to the relative displacement, for the generation of which reference marker fields are arranged at one or several positions on the side of the scale of the respective position measuring device. The scanning unit of such a position measuring device thus offers the possibility of generating an appropriate reference pulse signal at the relative position between the scale and the scanning unit to be detected, which is suitably processed in the downstream-connected evaluating device.

Therefore corresponding reference marker fields are provided on the scale, and reference pulse detector areas R, as well as incremental signal detector areas I in the form of detector areas D on the substrate 3 of the photodetector 6 for detecting the relative and absolute positions of the scanning unit and the scale which are used, for example, for detecting the relative and absolute positions of a workpiece and a tool in machine tools.

Further details regarding the object, function and design of the incremental graduation track and the reference marker fields on the scale, as well as the incremental signal detector areas and reference pulse detector areas of the photodetector for the generation of incremental and reference pulse signals, can be taken from the above mentioned WO 99/08074. For detecting the beams coming from the scale 2, a structured detector arrangement is provided in the exemplary embodiments in FIGS. 4 to 6, which include a plurality of active, i.e. radiation-sensitive detector areas, each of which has a narrow strip shape, and which are arranged periodically and next to each other in the measuring direction x. To this end, a suitable semiconductor substrate is structured in such a way that a number of radiation-sensitive detector areas results on the substrate. In case of a relative movement between the scale and the scanning unit, the different active detector areas each provide signal portions which are employed for generating phase-shifted incremental signals.

The view from above on a photodetector, schematically represented in FIG. 4, shows several groups of detector areas I1 to I6 arranged one behind the other and next to each other for detecting scanning signals, which are fed to an evaluation device in the form of incremental signals. In this case, four incremental signal detector areas form a group I1 to I6, wherewith respectively one instrumental signal detector area provides a partial incremental signal of the phase position 0°, one instrumental signal detector area a partial incremental signal of the phase position 180°, one instrumental signal detector area a partial incremental signal of the phase position 90°, and one instrumental signal detector area a partial incremental signal of the phase position 270°.

It is of course possible to select a different relative arrangement of the different incremental signal detector areas, so that these provide partial incremental signals with different phase positions than those of the example represented in FIG. 4. For example, an arrangement of the incremental signal detector areas would be possible which would provide signals with the phase positions of 0°, 120°, 240° . . . This arrangement does not have reference pulse signal detector areas.

The arrangement of the active detector areas represented in the example of FIG. 4 has the result that the adjoining active detector areas, located inside a graduation period, of a group of four, I1 to I6, provide four scanning signals which are each phase-shifted by 90° when the incremental graduation is optically scanned. A so-called "single field scan" of the scale is therefore assured by the represented arrangement of the detector areas, wherein all signal portions for generating the incremental signals always only stem from one graduation period of the scanned scale. This type of scanning is particularly advantageous because of the insensitivity with respect to large areas of contamination of the scale, since the phase-shifted signal portions contributing to the generation of the scanning signals are all equally affected.

The lateral edges 61, 62 of the active surface of the photodetector 6 in accordance with FIG. 1, which constitute the lateral edges of the semiconductor substrate, are schematically represented in FIG. 4, on which the radiation-sensitive detector areas are structured. Usually the length of the active detector areas perpendicularly in relation to the measuring direction x is limited in that the strip conductors connected with the detector areas are conducted between the front faces of the detector areas and the lateral edges 61, 62, or must be conducted from the front faces of the detector areas across the lateral edges to the printed circuit board, or to the rear of the semiconductor substrate.

In contrast to this, in the embodiment of the present invention the strip conductors L1 to L8 are conducted transversely in relation to the longitudinal extent of the detector areas D across the surface of the detector areas D. In this case the strip conductors L1 to L8 have an insulation at least on the side facing the surface of the detector areas D, which is only interrupted at predetermined locations K for making contact with predetermined detector areas. In this way, detector areas D2 of the individual groups I1 to I6, which provide in-phase scanning signals, are combined and passed on to the evaluation device for signal processing via contacts S1 to S4.

The exemplary embodiment represented in FIG. 4 shows the combination of four scanning signals, each phase-shifted by 90°, which result from the connection of the strip conductors L1 to L8 with the respective detector areas D of the groups of detector areas I1 to I6, which are arranged one behind the other and next to each other.

As can be taken from the representation of FIG. 4, the placement of the strip conductors L1 to L8 transversely across the longitudinal extensions of the detector areas D2 provides an optimal utilization of the available surface of the photodetector, in that the detector areas D can be brought directly to the lateral edges 61, 62 of the photodetector.

Figure 5:
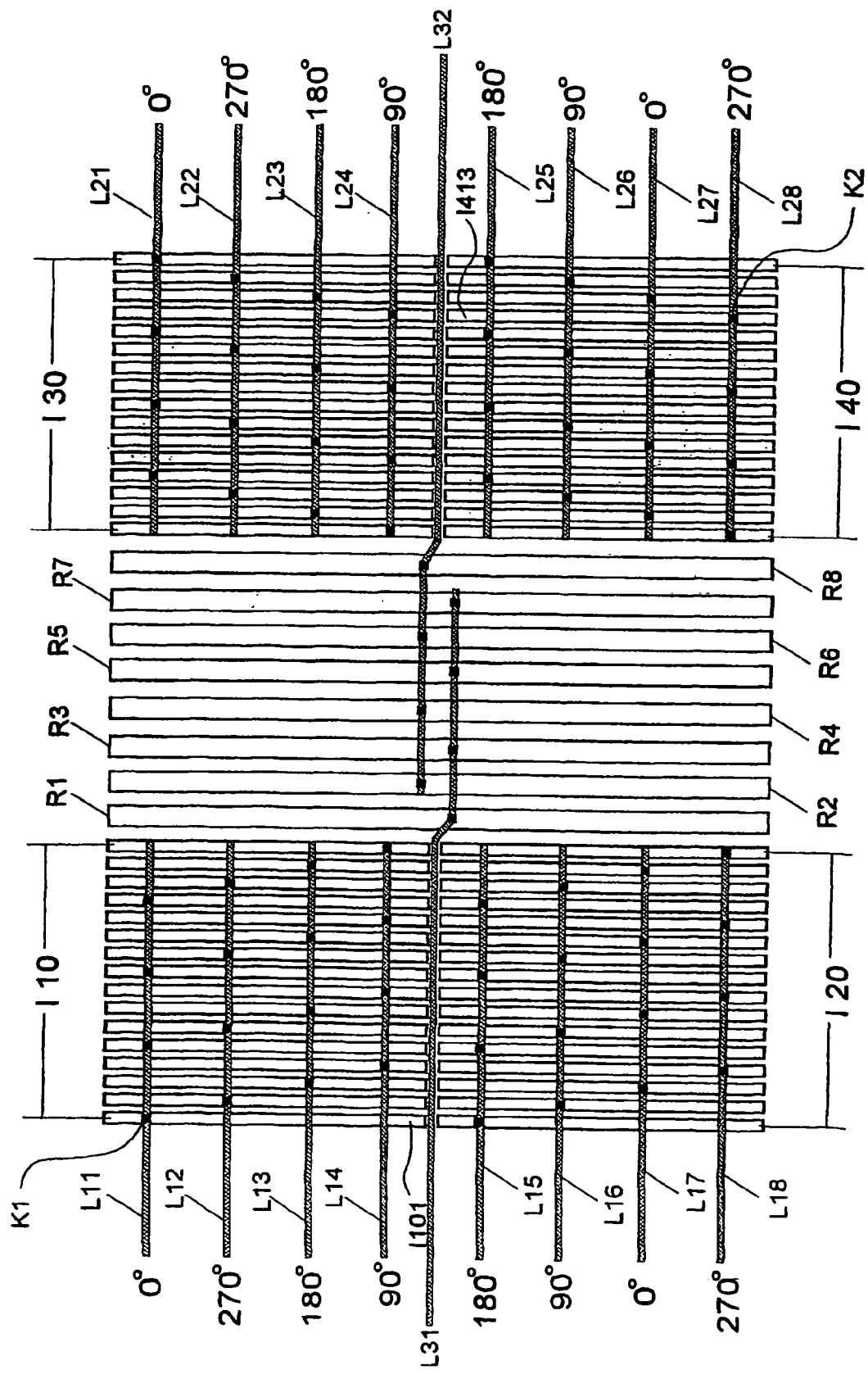
FIG. 5 shows a schematic representation of an embodiment of groups of incremental signal and reference pulse detector areas arranged one behind the other and next to each other, and strip conductors which combine detector areas providing in-phase and identical clock signals in accordance with the present invention.

Another form of a structured detector arrangement is represented in FIG. 5 in a view from above on a semiconductor substrate, for example, in which the active detector areas are embodied next to the inactive areas. In this embodiment incremental signals, as well as reference pulse signals, are provided as detector areas producing scanning signals, so that this arrangement is suitable for detecting the relative position of two systems which are moved in relation to each other, as well as an absolute position of the systems which are moved in relation to each other.

The incremental signals are detected in two incremental signal detector areas, which are separated from each other by a reference pulse signal detector area. The incremental signal detector areas I10, I20, I30 and I40 are constituted by partial areas combined into groups, which are arranged one behind the other in the measuring direction x. Detector areas which provide in-phase scanning signals make contact by strip conductors L11 to L28 extending transversely to the longitudinal extension of the detector areas, and therefore in the measuring direction x.

Each of the incremental signal detector areas I10, I20, I30, I40 provides incremental signals phase-shifted by 90° and they are accordingly combined with the corresponding detector areas via the strip conductors L11 to L28 by means of appropriate contact points. Thus, the strip conductors L11, L17, L21 and L27 provide the phase positions 0°, for example, while the strip conductors L12, L18, L22 and L28 provide the phase positions, phase-shifted by 90°, of 270° via respectively four detector groups, which are arranged one behind the other, of a detector area. In this case the strip conductor L11 at the contact point K1, for example, covers the detector areas 1101, while the strip conductor L28 at the contact point K2 covers the detector area 1413, etc.

The reference pulse signal detector area arranged between the incremental detector areas I10, I20, I30, I40 has several identical reference pulse detector areas R1 to R8, arranged one behind the other in the measuring direction, which, in contrast to the incremental signal detector areas which are arranged in groups next to each other, are embodied continuously from one to the other lateral edge of the detector arrangement. The reference pulse detector areas R1 to R8 make contact with a clock line and a push-pull line L31, L32 for creating the reference pulse signals, wherewith respectively one detector area R1 to R8 is skipped, so that every second detector area R1 to R8 is connected either with the clock line L32 or the push-pull line L32.

Analogous with the arrangement of the strip conductors in accordance with FIG. 4, in the exemplary embodiment represented in FIG. 5 the strip conductors L11 to L28 are also conducted transversely across the detector areas of the incremental signal detector areas I10, I20, I30, I40 to the front faces of the detector arrangement. Since the strip conductors L11 to L28 as a whole cover a small radiation-sensitive surface when crossing over the detector areas, it is possible in a way different from the configuration represented in FIG. 5 to also conduct respectively one single strip conductor across all (incremental signal and reference pulse) detector areas in order to detect the scanning signals, phase-shifted by 0°, 270°, 180° and 90°, of the groups arranged one behind the other in the measuring direction by making contact with the corresponding incremental signal detector areas. Although this demands the conduct of the strip conductors across the reference pulse detector areas R1 to R8, this would entail only a small interference with the reference pulse detector areas because of the large surface of the reference pulse detector areas.

In the exemplary embodiment represented in FIG. 5, the clock line and push-pull line L31, L32 for the reference pulse detector areas R1 to R8 have been passed between the incremental signal detector areas I10, I20, or I30, I40, located next to each other in the measuring direction x. This configuration utilizes the gap required anyway for the separation between the incremental signal detector areas I10, I20, or I30, I40, arranged next to each other, so that no active, i.e. radiation-sensitive surface is occupied. By arranging the clock line and push-pull line L31, L32 between the incremental signal detector areas I10, I20, or I30, I40 arranged next to each other, it becomes possible to conduct the front faces of the incremental signal detector areas I10, I20, I30, I40, as well as the reference pulse detector areas R1 to R8, directly up to the lateral edges of the detector arrangement, and in this way to provide a maximum active, i.e. radiation-sensitive surface for the detector areas.

Depending on the configuration and structural size of the photodetector, different ways to conduct the strip conductors, other than in the representations in FIGS. 4 and 5, are possible. For example, the clock line and push-pull line L31, L32 in the arrangement in FIG. 5 can also be guided along a lateral edge of the detector arrangement. But this restricts the possibility of extending the front faces of the incremental signal detector areas, as well as of the reference pulse detector areas, directly up to the lateral edges of the detector arrangement.

Figure 6:
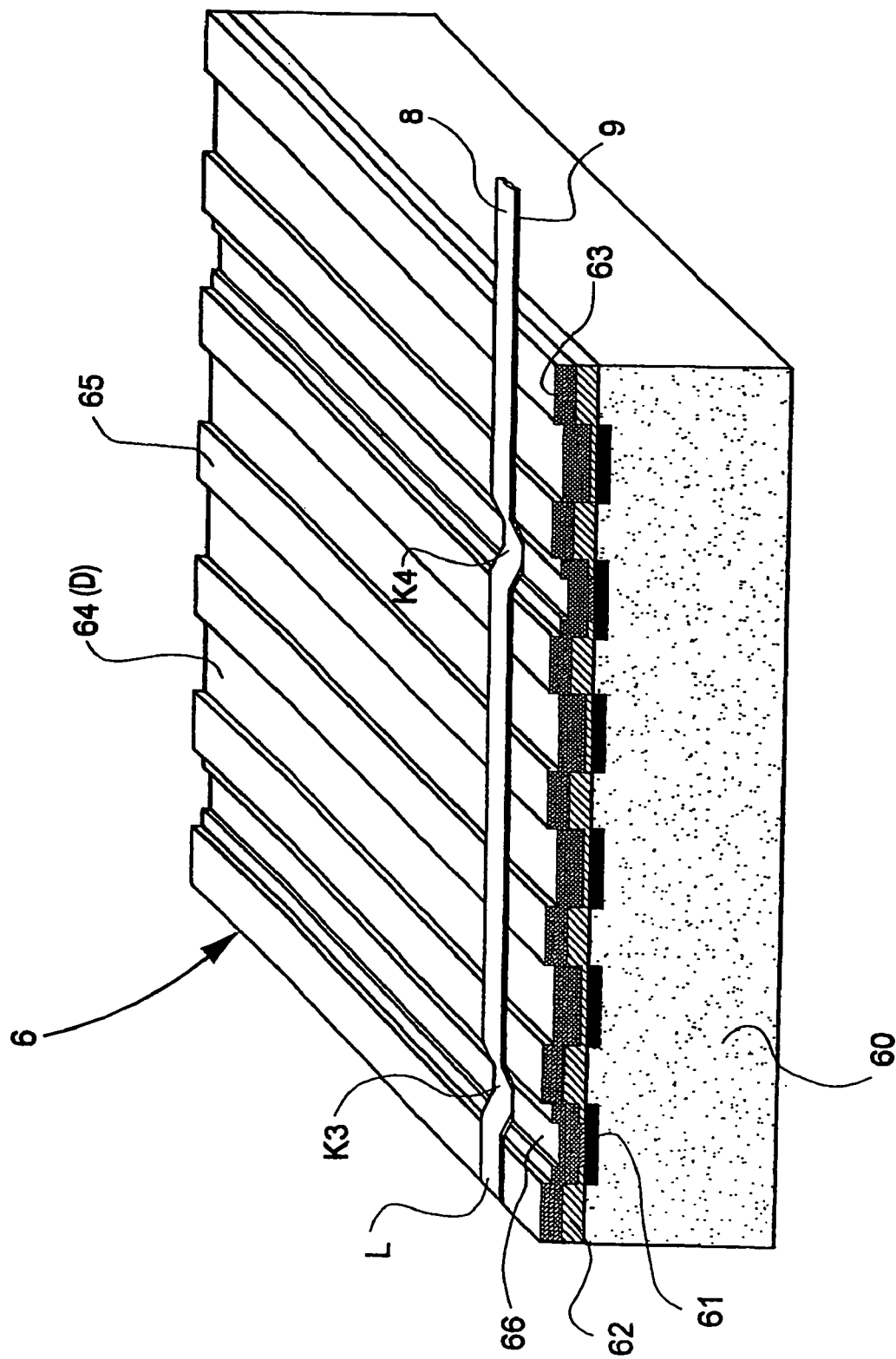
FIG. 6 shows a schematic-perspective representation of an embodiment of a photodetector with a strip conductor, which combines detector areas emitting in-phase scanning signals and has been placed across the detector areas in accordance with the present invention.

FIG. 6 shows a schematic-perspective plan view of an optoelectronic photodetector, or photo sensor, having a strip conductor L extending across the surface of the photodetector 6 and connected at two contacting locations K3, K4 with active, i.e. radiation-sensitive detector areas of the photodetector 6.

The semiconducting base body of the optoelectronic photodetector 6 is made of silicone, for example, and comprises a wide n-type layer 60 (300 μm to 400 μm thick), over whose surface extend, arranged equidistantly distributed, several considerably thinner p-type layers 61 (approximately 0.55 μm thick). Space-charge regions (depletion zones), which act as barrier layers, are formed between the n-type layer 60 and the p-type layers 61.

The front face of the optoelectronic photodetector 6 is provided with a metallic anti-reflection layer 63 and is structured by an insulating layer 62, which could include, for example, of silicone oxide as the insulator. Thus, the active, radiation-sensitive detector areas 64, or D, extend between the insulating or inactive areas 65.

Electromagnetic radiation impinging on the active, radiation-sensitive detector areas 64, or D reaches the space-charging region through the p-type layers 61 and is absorbed there to a large extent. In the process, electron-hole pairs are created in the space-charging region. The space-charging region separates these carrier pairs; electrons flow to the n-side, holes to the p-side. To be able to measure this photoelectric current, which is a measure for the impinging radiation output, the optoelectronic photodetector 6 is integrated into a suitable electrical circuit.

The strip conductor L, placed perpendicular to the longitudinal extension of the active detector areas 64 and over its surface, or applied in a different way, includes an electrically conductive portion 8, as well as an insulating layer 9, which is provided at least between the electrically conductive portion 8 and the surface of the optoelectronic photodetector 6. The insulating layer 9 leads to the strip conductor L making contact with the corresponding detector areas D of the photodetector 6 only at the desired locations, for example for detecting in-phase scanning signals and to pass them on to an evaluation device.

An opening in the anti-reflection layer 63 is provided at the contacting points K3, K4, where the strip conductor L is to be connected with the corresponding detector areas 64, or D, of the photodetector 6 or, as represented in FIG. 6, the anti-reflection layer 63 has been sufficiently lowered at the points 66, so that it comes into contact with the p-type layer 61 while bridging the insulating layer 62, and in this way the appropriate charge for generating a scanning signal can be coupled out.

The connection of the strip conductor L with the respective detector areas 64 at the contact points K3, K4 can take place by appropriate removal of the insulating layer 9 or by contacting through it. For example, the electrically conductive portion 8 of the strip conductor L can be conductively connected by a laser beam with the surface of the anti-reflection layer 63, or the lowered surface 66 of the respective detector area D.

In its execution, the invention is not limited to the preferred embodiments recited above, instead, a number of variants is conceivable, which make use of the solution represented in the drawings and specification even in connection with basically different types of embodiments.

We claim:

1. A scanning unit for an optical position measuring device, said scanning unit comprising:
a structured optoelectronic photodetector comprising:
a semiconductor substrate;
a plurality of radiation-sensitive detector areas, which are arranged next to each other on said semiconductor substrate, wherein said plurality of detector areas comprise narrow strips, which are sensitive to radiation, said narrow strips having longitudinal long sides arranged substantially next to each other perpendicular to a measuring direction, wherein said plurality of detector areas are arranged periodically with each other, wherein a plurality of adjoining detector areas form a first group which delivers scanning signals which are phase-shifted with respect to each other, wherein four of said plurality of adjoining detector areas form said first group and provide four scanning signals each of which is phase-shifted by 90° with respect to each other;
a strip conductor, wherein at least a portion of said strip conductor is positioned across a surface defined by said plurality of detector areas and forms a connection with an associated detector area of said plurality of detector areas, and said strip conductor is substantially oriented perpendicular to said longitudinal sides of said plurality of detector areas, and said strip conductor is connected with those detector areas of a second group of said plurality of adjoining detector areas which emit in-phase scanning signals;
a third group formed from said plurality of adjoining detector areas, wherein said first group and said third group of adjoining detector areas are arranged next to each other in a measuring direction, and four parallel strip conductors are connected with detector areas of said first group and said third group which emit in-phase scanning signals with respect to each other.

2. The scanning unit in accordance with claim 1, wherein said optoelectronic photodetector comprises:
a semiconducting base body of a first conductivity type that has an anti-reflection layer constituting a front of said photodetector and an insulating layer arranged between said semiconducting base body and said anti-reflection layer; and
thin, strip-shaped layers of a second conductivity type arranged on said semiconducting base body, said layers constituting said plurality of detector areas;
wherein said anti-reflection layer comprises an opening that is located at said connection of said strip conductor and said respective detector area.

3. The scanning unit in accordance with claim 1, wherein said optoelectronic photodetector comprises:
a semiconducting base body of a first conductivity type that has an anti-reflection layer constituting a front of said photodetector and an insulating layer arranged between said semiconducting base body and said anti-reflection layer; and
thin, strip-shaped layers of a second conductivity type arranged on said semiconducting base body, said strip-shaped layers constituting said plurality of detector areas;
wherein said anti-reflection layer is connected with one of said strip-shaped layers at said connection of said strip conductor and said respective detector area.

4. The scanning unit in accordance with claim 1, further comprising a fourth group formed from said plurality of adjoining detector areas;
wherein said first group and said third group are arranged next to each other in said measuring direction and said first group and said fourth group area are arranged parallel to each other in said measuring direction;
wherein said strip conductor is connected to those detector areas of said first group and said third group, that are arranged behind one another, which deliver in-phase scanning signals; and
a plurality of strip conductors that are connected with each other and, which detect in-phase scanning signals of detector areas of said third group and said fourth group, which are arranged parallel with each other in said measuring direction.

5. The scanning unit in accordance with claim 4, wherein said connection of said plurality of strip conductors which detect said in-phase scanning signals is arranged at a rear portion of said photodetector.

6. The scanning unit in accordance with claim 1, wherein said photodetector comprises:
a first group comprising a first set of detection areas;
a second group comprising a second set of detection areas, wherein said first group and said second group are arranged one behind the other in a measuring direction;
wherein said first group and said second group each comprises:
reference pulse detector areas for generating reference pulse signals, wherein said reference pulse detector areas are connected with reference pulse strip conductors; and
groups of incremental pulse detector areas for generating incremental signals, and
incremental signal detector areas provide in-phase output signals and that are each connected with an incremental signal strip conductor.

7. The scanning unit in accordance with claim 6, wherein said incremental signal strip conductors are conducted across radiation-sensitive surfaces of said incremental signal detector areas and are each connected with incremental signal detector areas which provide in-phase output signals.

8. A scanning unit for an optical position measuring device, said scanning unit comprising:
a structured optoelectronic photodetector comprising:
a semiconductor substrate;
a plurality of radiation-sensitive detector areas, which are arranged next to each other on said semiconductor substrate;
a strip conductor, wherein at least a portion of said strip conductor is positioned across a surface defined by said plurality of detector areas and forms a connection with an associated detector area of said plurality of detector areas, wherein said photodetector comprises:
a first group comprising a first set of detection areas;
a second group comprising a second set of detection areas, wherein said first group and said second group are arranged one behind the other in a measuring direction;
wherein said first group and said second group each comprises:
reference pulse detector areas for generating reference pulse signals, wherein said reference pulse detector areas are connected with reference pulse strip conductors; and
groups of incremental pulse detector areas for generating incremental signals, and
incremental signal detector areas provide in-phase output signals and that are each connected with an incremental signal strip conductor, wherein said groups of incremental signal detector areas comprises:
a first group of incremental signal detector areas; and
a second group of incremental signal detector areas, wherein each of said first and second groups of incremental signal detector areas comprises two groups of detector areas providing in-phase output signals and arranged one behind the other in a measuring direction and next to each other; and
said photodetector further comprises a group of reference pulse detector areas that is provided between said first and second groups of incremental signal detector areas, wherein said incremental signal strip conductors are each conducted to a front portion of said photodetector.

9. The scanning unit in accordance with claim 8, wherein said reference pulse strip conductors are arranged between said first and second groups of incremental signal detector areas, said reference pulse strip conductors are arranged next to each other in said measuring direction.

10. The scanning unit in accordance with claim 9, wherein a first one of said reference pulse strip conductors detects clock signals of said reference pulse detector areas and is conducted to a first front face between said first and second groups of incremental signal detector areas, which are arranged next to each other in said measuring direction, and a second one of said reference pulse strip conductors detects push-pull signals of group of said reference pulse detector areas and is conducted to a second front face between said first and second groups of incremental signal detector areas, which are arranged next to each other in said measuring direction.

11. The scanning unit in accordance with claim 9, wherein said first and second ones of said reference pulse strip conductors are arranged in sections above each other, and are conducted between said first and second groups of incremental signal detector areas of the one side, which are arranged next to each other in said measuring direction.

12. The scanning unit in accordance with claim 8, wherein said reference pulse strip conductors are conducted, at least in part, across oppositely arranged narrow sides of said first and second groups of incremental signal detector areas, which are arranged next to each other in said measuring direction.

13. The scanning unit in accordance with claim 8, wherein said first and second groups of incremental signal detector areas, which are arranged one behind the other in said measuring direction, are each connected with an incremental signal strip conductor for in-phase output signals, and that said incremental signal strip conductors are conducted across said reference pulse detector areas.

14. An optical position measuring device:
a scanning unit for an optical position measuring device, said scanning unit comprising:
a structured optoelectronic photodetector comprising:
a semiconductor substrate;
a plurality of radiation-sensitive detector areas, which are arranged next to each other on said semiconductor substrate; and
a strip conductor, wherein at least a portion of said strip conductor is positioned across a surface defined by said plurality of detector areas and forms a connection with an associated detector area of said plurality of detector areas;
a semiconducting base body of a first conductivity type that has an anti-reflection layer constituting a front of said photodetector and an insulating layer arranged between said semiconducting base body and said anti-reflection layer; and
thin, strip-shaped layers of a second conductivity type arranged on said semiconducting base body, said layers constituting said plurality of detector areas;
wherein said anti-reflection layer comprises an opening that is located at said connection of said strip conductor and said respective detector area; and
a scale that moves in a measuring direction relative to said scanning unit, wherein said scanning unit generates a measuring beam that is scanned by said scanning unit and said scanning unit generates a position signal based on said measuring beam.

15. The optical position measuring device in accordance with claim 14, wherein said plurality of detector areas comprise narrow strips, which are sensitive to radiation, said narrow strips having longitudinal long sides arranged substantially next to each other perpendicular to a measuring direction, and said strip conductor is substantially oriented perpendicular to said longitudinal sides of said plurality of detector areas.

16. The optical position measuring device in accordance with claim 14, wherein said plurality of detector areas are arranged periodically with each other, wherein a plurality of adjoining detector areas form a first group which delivers scanning signals which are phase-shifted with respect to each other, and said strip conductor is connected with those detector areas of a second group of said plurality of adjoining detector areas which emit in-phase scanning signals.

17. The optical position measuring device in accordance with claim 14, wherein said photodetector comprises:
a first group comprising a first set of detection areas;
a second group comprising a second set of detection areas, wherein said first group and said second group are arranged one behind the other in a measuring direction;
wherein said first group and said second group each comprises:
reference pulse detector areas for generating reference pulse signals, wherein said reference pulse detector areas are connected with reference pulse strip conductors; and
groups of incremental pulse detector areas for generating incremental signals, and
incremental signal detector areas provide in-phase output signals and that are each connected with an incremental signal strip conductor.

18. The optical position measuring device in accordance with claim 17, wherein said incremental signal strip conductors are conducted across radiation-sensitive surfaces of said incremental signal detector areas and are each connected with incremental signal detector areas which provide in-phase output signals.

19. The optical position measuring device in accordance with claim 17, wherein said groups of incremental signal detector areas comprises:
a first group of incremental signal detector areas; and
a second group of incremental signal detector areas, wherein each of said first and second groups of incremental signal detector areas comprises two groups of detector areas providing in-phase output signals and arranged one behind the other in a measuring direction and next to each other; and
said photodetector further comprises a group of reference pulse detector areas that is provided between said first and second groups of incremental signal detector areas, wherein said incremental signal strip conductors are each conducted to a front portion of said photodetector.

20. The optical position measuring device in accordance with claim 19, wherein said reference pulse strip conductors are arranged between said first and second groups of incremental signal detector areas, said reference pulse strip conductors are arranged next to each other in said measuring direction.

21. The optical position measuring device in accordance with claim 20, wherein a first one of said reference pulse strip conductors detects clock signals of said reference pulse detector areas and is conducted to a first front face between said first and second groups of incremental signal detector areas, which are arranged next to each other in said measuring direction, and a second one of said reference pulse strip conductors detects push-pull signals of group of said reference pulse detector areas and is conducted to a second front face between said first and second groups of incremental signal detector areas, which are arranged next to each other in said measuring direction.

22. The optical position measuring device in accordance with claim 20, wherein said first and second ones of said reference pulse strip conductors are arranged in sections above each other, and are conducted between said first and second groups of incremental signal detector areas of the one side, which are arranged next to each other in said measuring direction.

23. The optical position measuring device in accordance with claim 19, wherein said reference pulse strip conductors are conducted, at least in part, across oppositely arranged narrow sides of said first and second groups of incremental signal detector areas, which are arranged next to each other in said measuring direction.

24. The optical position measuring device in accordance with claim 19, wherein said first and second groups of incremental signal detector areas, which are arranged one behind the other in said measuring direction, are each connected with an incremental signal strip conductor for in-phase output signals, and that said incremental signal strip conductors are conducted across said reference pulse detector areas.

25. The optical position measuring device in accordance with claim 15, wherein four of said plurality of adjoining detector areas form said first group and provide four scanning signals each of which is phase-shifted by 90° with respect to each other;
said photodetector further comprising:
a third group formed from said plurality of adjoining detector areas, wherein said first group and said third group of adjoining detector areas are arranged next to each other in a measuring direction, and four parallel strip conductors are connected with detector areas of said first group and said third group which emit in-phase scanning signals.

26. The optical position measuring device in accordance with claim 25, further comprising a fourth group formed from said plurality of adjoining detector areas;
wherein said first group and said third group are arranged next to each other in said measuring direction and said first group and said fourth group area are arranged parallel to each other in said measuring direction;
wherein said strip conductor is connected to those detector areas of said first group and said third group, that are arranged behind one another, which deliver in-phase scanning signals; and
a plurality of strip conductors that are connected with each other and, which detect in-phase scanning signals of detector areas of said third group and said fourth group, which are arranged parallel with each other in said measuring direction.

27. The optical position measuring device in accordance with claim 26, wherein said connection of said plurality of strip conductors which detect said in-phase scanning signals is arranged at a rear portion of said photodetector.

28. An optical position measuring device:
a scanning unit for an optical position measuring device, said scanning unit comprising:
a structured optoelectronic photodetector comprising:
a semiconductor substrate;
a plurality of radiation-sensitive detector areas, which are arranged next to each other on said semiconductor substrate, wherein said plurality of detector areas comprise narrow strips, which are sensitive to radiation, said narrow strips having longitudinal long sides arranged substantially next to each other perpendicular to a measuring direction, wherein said plurality of detector areas are arranged periodically with each other, wherein a plurality of adjoining detector areas form a first group which delivers scanning signals which are phase-shifted with respect to each other, wherein four of said plurality of adjoining detector areas form said first group and provide four scanning signals each of which is phase-shifted by 90° with respect to each other;
  a strip conductor, wherein at least a portion of said strip conductor is positioned across a surface defined by said plurality of detector areas and forms a connection with an associated detector area of said plurality of detector areas, and said strip conductor is substantially oriented perpendicular to said longitudinal sides of said plurality of detector areas, and said strip conductor is connected with those detector areas of a second group of said plurality of adjoining detector areas which emit in-phase scanning signals;
  wherein four of said plurality of adjoining detector areas form said first group and provide four scanning signals each of which is phase-shifted by 90° with respect to each other;
  said photodetector further comprising:
    a third group formed from said plurality of adjoining detector areas, wherein said first group and said third group of adjoining detector areas are arranged next to each other in said measuring direction, and four parallel strip conductors are connected with detector areas of said first group and said third group which emit in-phase scanning signals with respect to each other; and
  a scale that moves in a measuring direction relative to said scanning unit, wherein said scanning unit generates a measuring beam that is scanned by said scanning unit and said scanning unit generates a position signal based on said measuring beam.

29. The optical position measuring device in accordance with claim 28, wherein said optoelectronic photodetector comprises:
  a semiconducting base body of a first conductivity type that has an anti-reflection layer constituting a front of said photodetector and an insulating layer arranged between said semiconducting base body and said anti-reflection layer; and
  thin, strip-shaped layers of a second conductivity type arranged on said semiconducting base body, said strip-shaped layers constituting said plurality of detector areas;
  wherein said anti-reflection layer is connected with one of said strip-shaped layers at said connection of said strip conductor and said respective detector area.

30. The optical position measuring device in accordance with claim 28, further comprising a fourth group formed from said plurality of adjoining detector areas;
  wherein said first group and said third group are arranged next to each other in said measuring direction and said first group and said fourth group area are arranged parallel to each other in said measuring direction;
  wherein said strip conductor is connected to those detector areas of said first group and said third group, that are arranged behind one another, which deliver in-phase scanning signals; and
  a plurality of strip conductors that are connected with each other and, which detect in-phase scanning signals of detector areas of said third group and said fourth group, which are arranged parallel with each other in said measuring direction.

31. The optical position measuring device in accordance with claim 30, wherein said connection of said plurality of strip conductors which detect said in-phase scanning signals is arranged at a rear portion of said photodetector.

32. The optical position measuring device in accordance with claim 28, wherein said optoelectronic photodetector comprises:
  a semiconducting base body of a first conductivity type that has an anti-reflection layer constituting a front of said photodetector and an insulating layer arranged between said semiconducting base body and said anti-reflection layer; and
  thin, strip-shaped layers of a second conductivity type arranged on said semiconducting base body, said layers constituting said plurality of detector areas;
  wherein said anti-reflection layer comprises an opening that is located at said connection of said strip conductor and said respective detector area.

33. An optical position measuring device:
  a scanning unit for an optical position measuring device, said scanning unit comprising:
  a structured optoelectronic photodetector comprising:
    a semiconductor substrate;
    a plurality of radiation-sensitive detector areas, which are arranged next to each other on said semiconductor substrate;
  a strip conductor, wherein at least a portion of said strip conductor is positioned across a surface defined by said plurality of detector areas and forms a connection with an associated detector area of said plurality of detector areas,
  wherein said photodetector comprises:
    a first group comprising a first set of detection areas;
    a second group comprising a second set of detection areas, wherein said first group and said second group are arranged one behind the other in a measuring direction;
    wherein said first group and said second group each comprises:
      reference pulse detector areas for generating reference pulse signals, wherein said reference pulse detector areas are connected with reference pulse strip conductors; and
      groups of incremental pulse detector areas for generating incremental signals, and
      incremental signal detector areas provide in-phase output signals and that are each connected with an incremental signal strip conductor, wherein said groups of incremental signal detector areas comprises:
        a first group of incremental signal detector areas; and
        a second group of incremental signal detector areas, wherein each of said first and second groups of incremental signal detector areas comprises two groups of detector areas providing in-phase output signals and arranged one behind the other in a measuring direction and next to each other; and
    said photodetector further comprises a group of reference pulse detector areas that is provided between said first and second groups of incremental signal detector areas, wherein said incremental signal strip conductors are each conducted to a front portion of said photodetector; and a scale that moves in a measuring direction relative to said scanning unit, wherein said scanning unit generates a measuring beam that is scanned by said scanning unit and said scanning unit generates a position signal based on said measuring beam.

34. The optical position measuring device in accordance with claim 33, wherein said incremental signal strip conductors are conducted across radiation-sensitive surfaces of said incremental signal detector areas and are each connected with incremental signal detector areas which provide in-phase output signals.

35. The optical position measuring device in accordance with claim 33, wherein said reference pulse strip conductors are arranged between said first and second groups of incremental signal detector areas, said reference pulse strip conductors are arranged next to each other in said measuring direction.

36. The optical position measuring device in accordance with claim 35, wherein a first one of said reference pulse strip conductors detects clock signals of said reference pulse detector areas and is conducted to a first front face between said first and second groups of incremental signal detector areas, which are arranged next to each other in said measuring direction, and a second one of said reference pulse strip conductors detects push-pull signals of group of said reference pulse detector areas and is conducted to a second front face between said first and second groups of incremental signal detector areas, which are arranged next to each other in said measuring direction.

37. The optical position measuring device in accordance with claim 35, wherein said first and second ones of said reference pulse strip conductors are arranged in sections above each other, and are conducted between said first and second groups of incremental signal detector areas of the one side, which are arranged next to each other in said measuring direction.

38. The optical position measuring device in accordance with claim 33, wherein said reference pulse strip conductors are conducted, at least in part, across oppositely arranged narrow sides of said first and second groups of incremental signal detector areas, which are arranged next to each other in said measuring direction.

39. The optical position measuring device in accordance with claim 33, wherein said first and second groups of incremental signal detector areas, which are arranged one behind the other in said measuring direction, are each connected with an incremental signal strip conductor for in-phase output signals, and that said incremental signal strip conductors are conducted across said reference pulse detector areas.

* * * * *